(12) United States Patent
Gauthier et al.

(10) Patent No.: US 6,784,752 B2
(45) Date of Patent: Aug. 31, 2004

(54) POST-SILICON PHASE OFFSET CONTROL OF PHASE LOCKED LOOP INPUT RECEIVER

(75) Inventors: Claude Gauthier, Fremont, CA (US); Brian Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/131,288

(22) Filed: Apr. 24, 2002

(65) Prior Publication Data

US 2003/0201841 A1 Oct. 30, 2003

(51) Int. Cl.[7] .................................................. H03B 5/00
(52) U.S. Cl. ............................. 331/16; 327/7; 327/152; 327/153; 327/155; 327/156; 327/25; 327/141; 327/161; 331/17; 331/25
(58) Field of Search ............................... 331/16, 17, 25, 331/185; 327/7, 152, 153, 155, 156, 25, 141, 161

(56) References Cited

U.S. PATENT DOCUMENTS 6,043,717 A * 3/2000 Kurd ........................... 331/17
6,542,038 B2 * 4/2003 Nishimura .................... 331/25

FOREIGN PATENT DOCUMENTS

JP 5129944 * 5/1993

OTHER PUBLICATIONS

Lee et al. "Design Self–Sychronized Clock Distribution Networks in an SOC ASIC using DLL with Remote Clock Feedback" 13th Annual IEEE International ASIC/SOC Conference 2000 pp 248–252.*
Gibilisco "Handbook of Radio & Wireless Technology" McGraw Hill 1999 pp 90–93.*
"Low–Jitter Process–Independent DLL and PLL Based on Self–Biased Techniques" Author: John G. Maneatis, As published in: "IEEE Journal of Solid–State Circuits" vol. 31, No. 11, Nov., 1996 (10 pages).

* cited by examiner

Primary Examiner—Michael B Shingleton
(74) Attorney, Agent, or Firm—Osha & May L.L.P.

(57) ABSTRACT

A phase locked loop that includes a receiver that is adjustable to substantially match delay of a system clock and a feedback clock at an input of the phase locked loop is provided. The receiver employs system clock path circuitry to input the system clock and feedback clock path circuitry to input the feedback clock, where current flow and load resistances associated with the system clock path circuitry and current flow and load resistances associated with the feedback clock path circuitry are responsive to one or more bias signals that are adjustable using one or more adjustment circuits that are operatively connected to the receiver. The control of the one or more bias signals via the one or more adjustment circuits facilitates the generation of substantially delay matched system and feedback clocks.

35 Claims, 6 Drawing Sheets

POST-SILICON PHASE OFFSET CONTROL OF PHASE LOCKED LOOP INPUT RECEIVER

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal (shown in FIG. 1 as CHIP_CLK) to the microprocessor 12. The system clock and chip clock have a specific phase and frequency relationship controlled by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 become non-deterministic.

FIG. 2 shows a PLL 20 in more detail. The PLL 20 comprises a feedback loop that aligns the transition edge and frequency of the system clock 41 and a feedback loop signal 40. The PLL 20 adjusts the output frequency in order to zero any phase and frequency difference between the system clock 41 and the feedback loop signal 40. The addition of a divide-by-N circuit 39 in the feedback loop enables the PLL 20 to generate an output that has a frequency of N times the system clock 41 frequency. Multiplying the system clock is useful when the chip clock 42 must have a higher frequency than the system clock 41. The PLL core 36 adjusts the output frequency in order to zero any phase and frequency difference between the system clock 41 and the feedback loop signal 40. By adding the divide by N block 39, the chip clock 42 must be N times faster to allow the phase and frequency difference between the system clock 41 and the feedback loop signal 40 to zero. The PLL 20 may also have buffers 37 and 38 to drive a larger resistive and/or capacitive load. The buffers 37 and 38 are in the feedback loop so that any phase shift created by the buffers 37 and 38 is zeroed by the PLL core 36.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, an integrated circuit comprises: a phase locked loop comprising a voltage controlled oscillator that generates an output clock dependent on an input thereto, an input receiver comprising a system clock path and a feedback clock, a phase frequency detector responsive to the input receiver, and a bias generator (responsive to the phase frequency detector) arranged to provide a voltage to the input of the voltage controlled oscillator; and an adjustment circuit operatively connected to the input receiver, where the adjustment circuit is controllable to adjust a delay of any one of the system clock and the feedback clock.

According to another aspect, a phase locked loop comprises an input receiver adapted to input a system clock and a feedback clock and is responsive to an adjustment circuit operatively connected to the input receiver, where the adjustment circuit is adapted to be controllable to adjust a delay of any one of the system clock and the feedback clock; a phase frequency detector responsive to the input receiver; a bias generator responsive to the phase frequency detector; and a voltage controlled oscillator responsive to the bias generator, wherein the voltage controlled oscillator is adapted to output an output clock.

According to another aspect, a method for post-silicon adjustment of a phase locked loop comprises inputting a system clock and a feedback clock to an input receiver, selectively adjusting a delay of any one of the system clock and the feedback clock using an adjustment circuit operatively connected to the input receiver, comparing the system clock and the feedback clock, and generating a voltage to a voltage controlled oscillator dependent on the comparing, wherein the voltage controlled oscillator generates an output clock.

According to another aspect, an integrated circuit comprises phase locked loop means for generating an output clock, wherein the phase locked loop means comprises input means for inputting a system clock and a feedback clock, charge pumping means for generating a control voltage, bias generating means for generating a bias voltage, and oscillator means for generating the output clock; and adjusting means for adjusting a delay of any one of the system clock and the feedback clock, where the adjusting means is operatively connected to the input means.

Other aspects and advantages of the invention will be apparent from the following description and the appended claims.

BRIEF DESCRIPTION OF DRAWINGS

FIG. 4b shows a portion of a phase locked loop in accordance with the embodiment shown in FIG. 4a.

DETAILED DESCRIPTION

Figure 1:
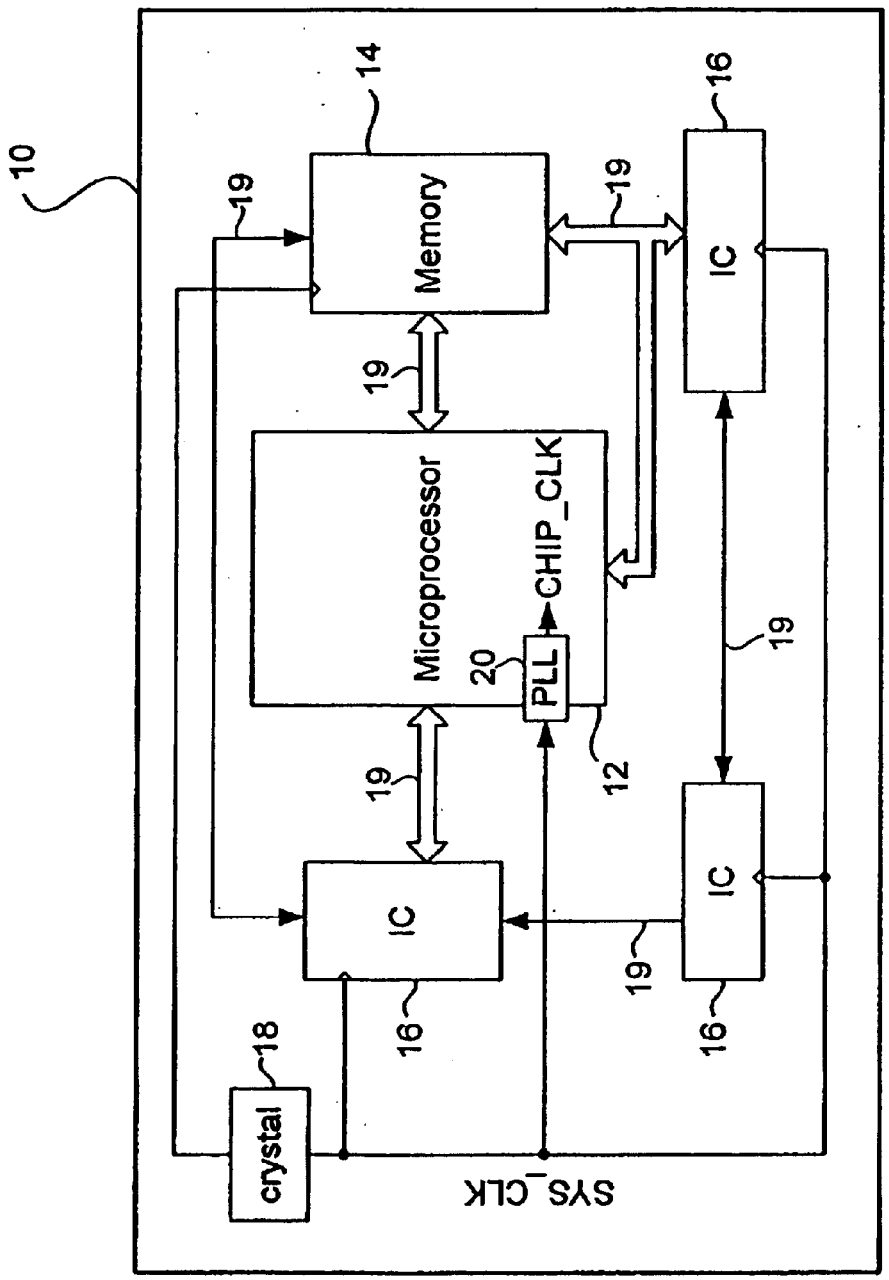
FIG. 1 shows a typical computer system.
Figure 2:
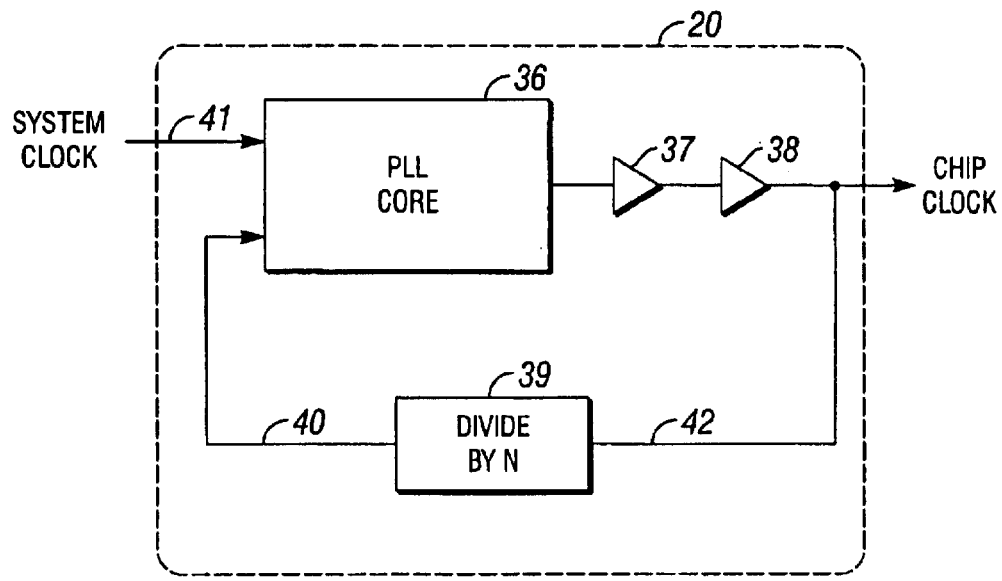
FIG. 2 shows a block diagram of a typical phase locked loop.
Figure 3A:
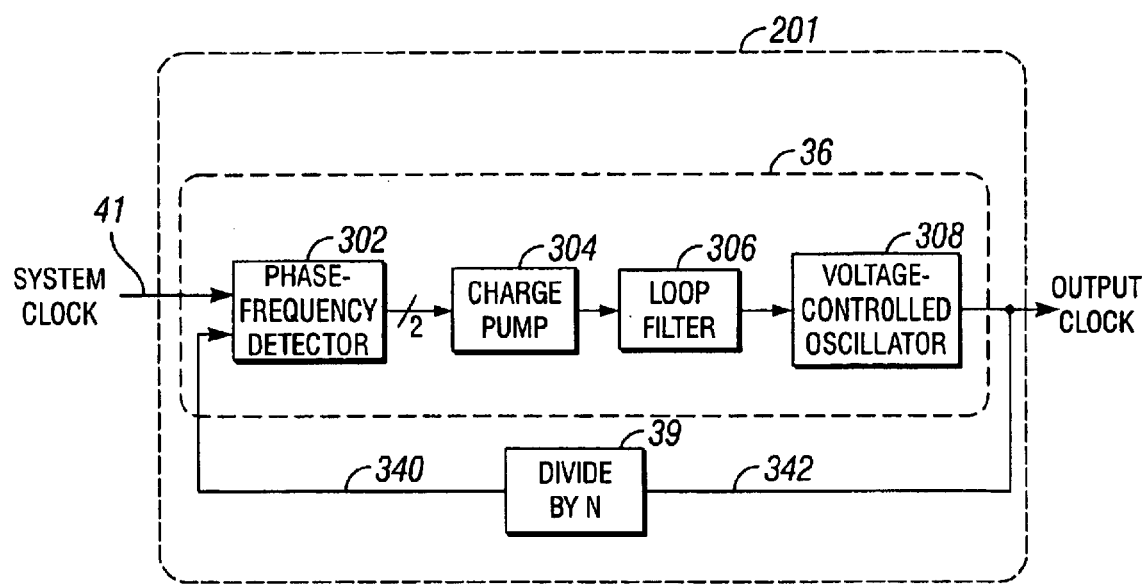
FIG. 3a shows a circuit diagram of a phase locked loop.

FIG. 3a shows a diagram of a PLL 201. The PLL 201 has an input of system clock 41 that is used to create a phased output, output clock 342. The basic elements of the PLL core 36 are a phase-frequency detector 302, charge pump 304, loop filter 306, and voltage-controlled oscillator 308. Output clock 342 may have a higher frequency than the system clock 41. A divide-by-N circuit 39 is used to reduce the frequency of the output clock 342 so that the system clock 41 and divided output clock 340 can be input to the phase-frequency detector 302. The phase-frequency detector 302 measures the phase and frequency difference between system clock 41 and divided output clock 340. The phase-frequency detector 302 produces signals that control a charge pump 304, typically up or down pulses (not shown), to increase or decease the net charge at the output of the charge pump 304. The charge pump 304 adds or removes charge from the loop filter 306. The loop filter 306 may be composed of a resistor and capacitor in series that are connected to ground. The charge pump 304 adjusts the voltage stored on the capacitor in the loop filter 306. The voltage-controlled oscillator 308 produces the output clock 342 that has a frequency proportional to the voltage input to the voltage-controlled oscillator 308. Because the voltage input to the voltage-controlled oscillator 308 may be susceptible to power supply noise, the output clock 342 may jitter.

Figure 3B:
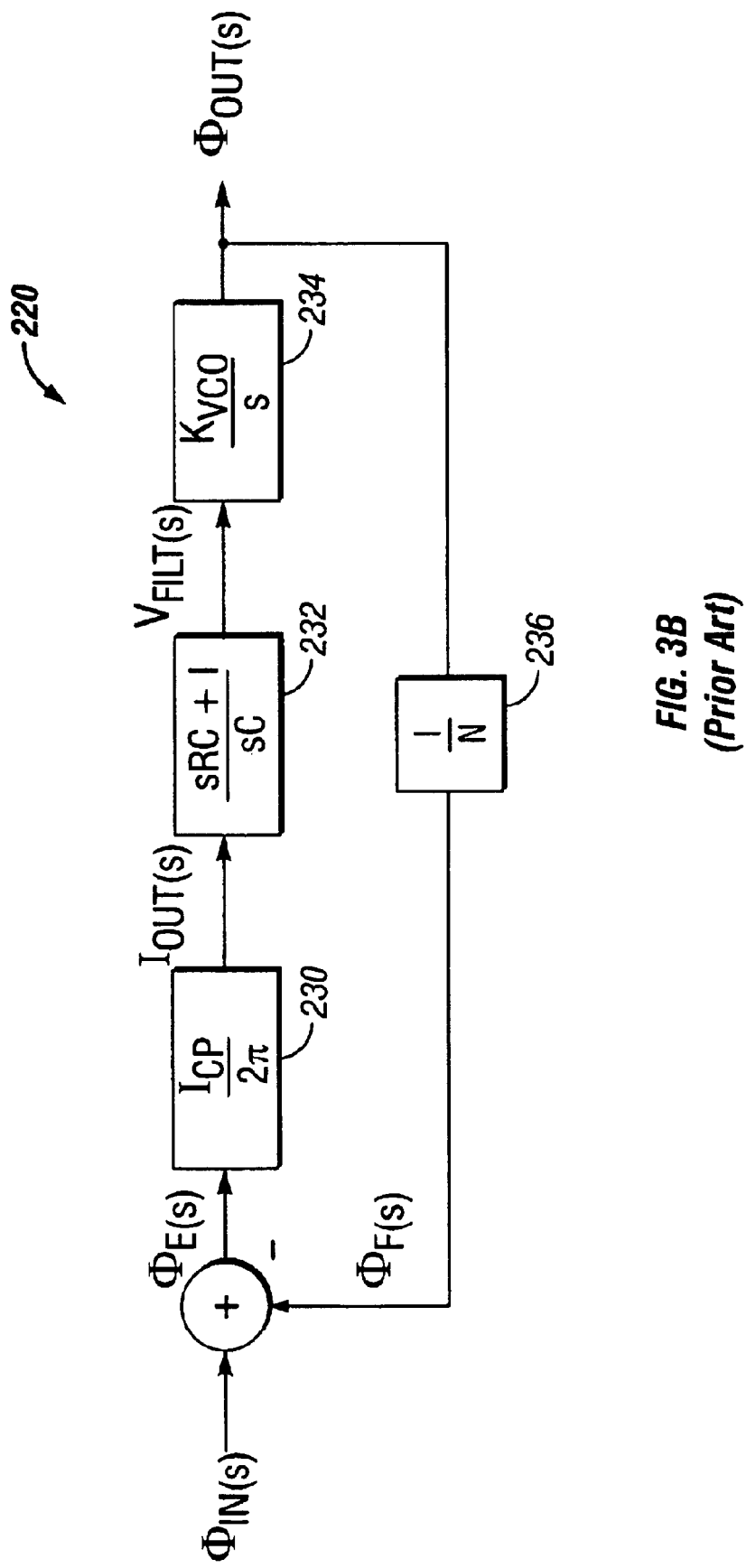
FIG. 3b shows a control diagram of a phase locked loop.

In FIG. 3b, the frequency response of the PLL 220 may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump 230 adds or removes charge to its output depending on the state of input control signals, typically up or down pulses (not shown). Both pulses may be 'on' at the same time, however, if the up or the down pulse remains 'on' longer than the other, the net charge at the output of the charge pump 230 increases or decreases. The charge pump gain may be modeled as a linear gain versus phase error where $I_{OUT}(s)/\Phi_E(s)=I_{CP}/2\pi$. The loop filter 232 may be modeled as a series combination of a capacitor, C, and a resistor, R, connected from $I_{OUT}$ to ground. The loop filter 232 transforms the output of the charge pump, $I_{OUT}$, into the voltage-controlled oscillator input voltage, $V_{FILT}$. The Laplace transform of the series resistor and capacitor in the loop filter 232 is $V_{FILT}(s)/I_{OUT}(s)=(sRC+1)/(sC)$. The transfer function of the capacitor and resistor shows that a zero is added, whereby the zero adds stability to the PLL loop. The voltage-controlled oscillator 234 outputs a clock that has a frequency proportional to the input voltage $V_{FILT}$. The Laplace transform of the voltage-controlled oscillator 234 is $\Phi_{OUT}(s)/V_{FILT}(s)=I_{CP}/V_{FILT}(S)=K_{VCO}/s$. The closed-loop transfer function can now be derived as $H(s)=\Phi_{OUT}(s)/\Phi_{IN}(s)=[(RK_{VCO}I_{CP}/2\pi)/(s+1/RC)]/[s^2+s\ R\ C\ K_{VCO}I_{CP}/2\pi NC+K_{VCO}I_{CP}/2\pi NC]$. H(s) is a second order system that has one pole from the loop filter 232 and one pole from the voltage-controlled oscillator 234, and one zero from the resistor, R, in the loop filter 232. The transfer function H(s) has a natural frequency $\omega_n=(K_{VCO}I_{CP}/2\pi NC)^{0.5}$ and a damping factor $\zeta=RC\omega_n/2$.

The loop bandwidth is defined as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input jitter. High loop bandwidth allows the PLL to more closely follow and compensate for output error induced by power supply noise. Thus, a design tradeoff must be made in the loop bandwidth of the PLL. The value for C has a large effect on loop bandwidth and natural frequency. Optimizing the PLL loop bandwidth relates to balancing the effect and treatment of input error with the PLL loop's speed of response to compensate for output error induced by power supply noise.

In order to facilitate the achievement of improved/optimal PLL performance, embodiments of the present invention relate to a PLL that includes a receiver circuit that reduces a static phase error of the PLL, where the input receiver is operatively connected to one or more adjustment circuits that are controllable to adjust one or more bias signals to which the input receiver is responsive. Embodiments of the present invention further relate to a PLL that includes an input receiver that substantially matches a delay of a system clock path and a delay of a feedback clock path dependent on one or more bias signals, where the one or more bias signals are adjustable by one or more adjustment circuits operatively connected to the input receiver. Embodiments of the present invention further relate to a PLL that includes an input receiver that reduces a delay of a system clock path and a delay of a feedback clock path dependent on one or more bias signals, where the one or more bias signals are adjustable by one or more adjustment circuits operatively connected to the input receiver.

Figure 4A:
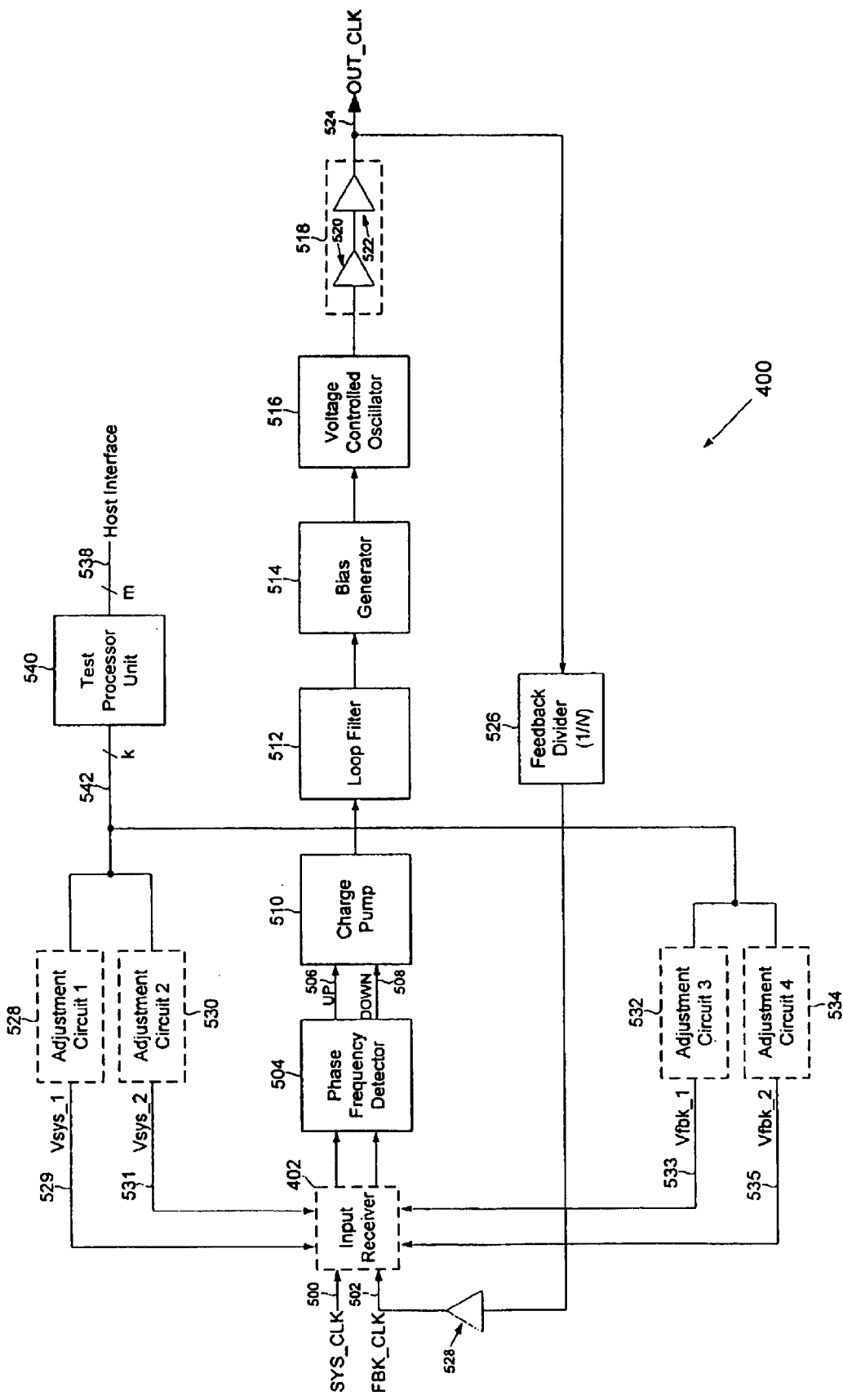
FIG. 4a shows a phase locked loop and adjustment circuits in accordance with an embodiment of the present invention.
Figure 4B:
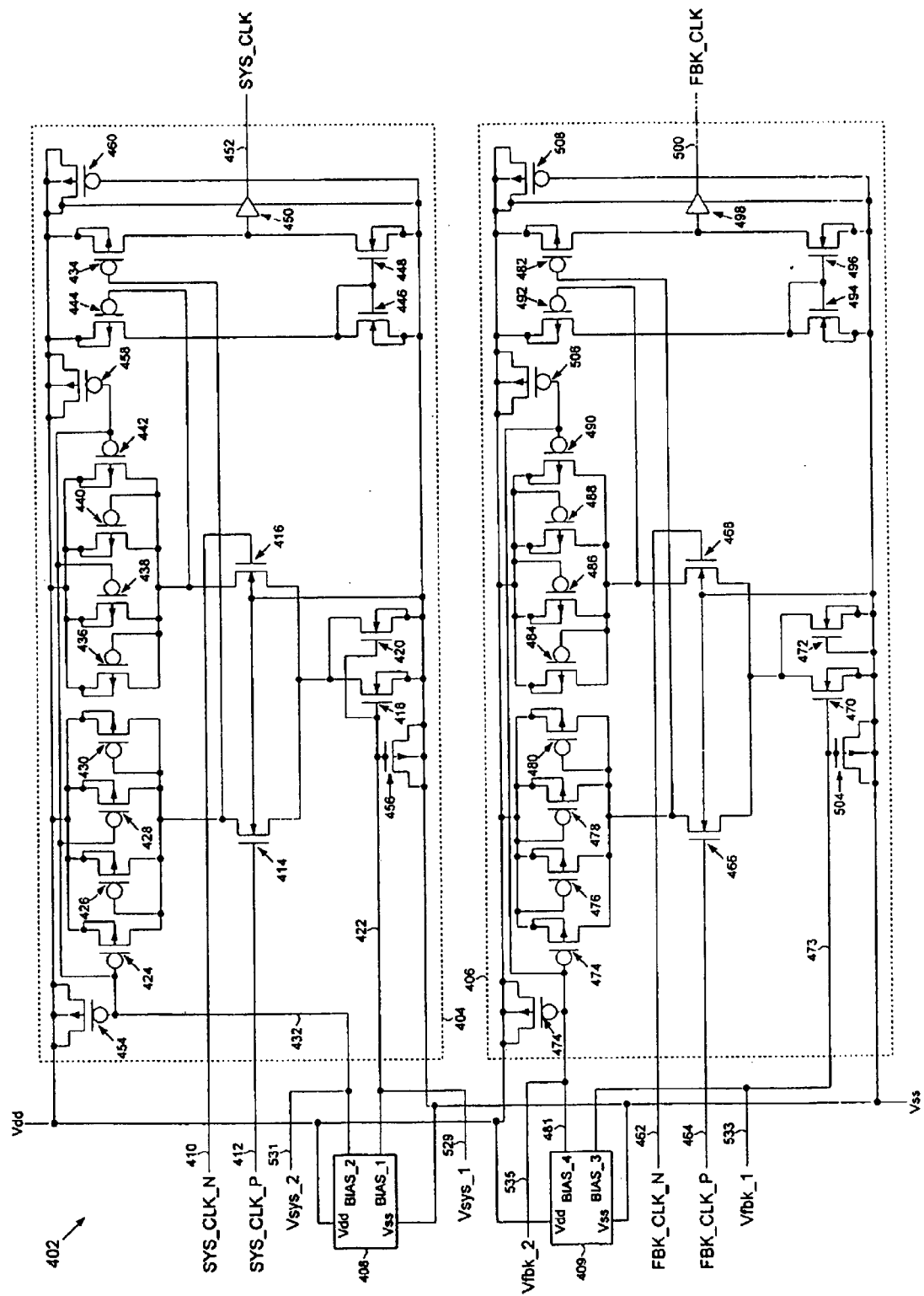

FIG. 4a shows an exemplary embodiment of the present invention. In FIG. 4a, a PLL 400 includes an input receiver 402 that inputs a system clock 500 (labeled in FIG. 4a as SYS_CLK) and a feedback clock 502 (labeled in FIG. 4a as FBK_CLK). The input receiver 402, as will be described below with reference to FIG. 4b, is controllable to match and/or minimize the delays of the system clock 500 and the feedback clock 502. The input receiver 402 is controllable due to being operatively connected to adjustment circuits 528, 530, 532, and 534 (a discussion of an embodiment of an adjustment circuit in accordance with the present invention is given below with reference to FIG. 4c). The adjustment circuits 528, 530, 532, and 534 generate adjustment control voltages Vsys_1 529, Vsys_2 531, Vfbk_1 533, and Vfbk_2 535, respectively, The adjustment control voltages Vsys_1 529, Vsys_2 531, Vfbk_1 533, and Vfbk_2 535 are used to adjust internal bias signals of the input receiver 402 (discussed below with reference to FIG. 4b). Adjusting the internal bias signal values of the input receiver 402 modulates delays of the system clock 500 and the feedback clock 502. In embodiments of the present invention, the input receiver 402 may be adjusted to substantially match the delays of the system clock 500 and the feedback clock 502.

In FIG. 4a, a test processor unit 540 controls the adjustment circuits 528, 530, 532, and 534 using k control signals 542. The values of the k control signals 542 may be determined by the contents of registers or other storage devices maintained in the test processor unit 540. In some embodiments, the test processor unit 540 may be accessed through a host interface, where the host interface communicates with the test processor unit 540 via m communication lines 538.

Those skilled in the art will appreciate that the host interface and the m communication lines 538 may be implemented using one or more of a variety of forms. For example, the host interface may be operated from a computer system distinct from the one in which the PLL 400 resides. In some embodiments, the communication occurring on the host interface and m communication lines 538 may be defined by an industry standard such as JTAG (IEEE 1149).

In some embodiments, more than one test processor unit may be used to control the adjustment circuits 528, 530, 532, and 534. In some embodiments, an adjustment circuit may be controlled by a particular test processor unit or a group of test processor units. In some embodiments, the input receiver 402 may be connected to a different number of adjustment circuits than the amount of adjustment circuits shown in FIG. 4a.

Still referring to FIG. 4a, the input receiver 402 outputs the delay matched system and feedback clocks to a phase frequency detector 504, which compares the phases of the delay matched system and feedback clocks. Depending on the comparison, the phase frequency detector 504 outputs UP and DOWN pulses 506 and 508 to a charge pump 510, which then outputs to a loop filter 512. The loop filter 512 controls the voltage value of an input to a bias generator 514, which, in turn, controls a voltage controlled oscillator 516. An output from the voltage controlled oscillator 516 propagates through a clock distribution network 518 (modeled in FIG. 4a as buffers 520 and 522) and serves as an output clock 524 of the PLL 400 (labeled in FIG. 4a as CHIP_CLK). The output clock 524 is fed back through a feedback divider 526, which, in turn, outputs to a buffer 528 that generates the feedback clock 502 to the input receiver 402.

FIG. 4b shows an input receiver 402 in accordance with the exemplary embodiment shown in FIG. 4a. In general terms, the input receiver 402 uses a system clock path 404, a feedback clock path 406, a first bias control stage 408, and a second bias control stage 409.

The system clock path 404 includes a differential input pair for receiving differential components of the system clock, SYS_CLK_N 410 and SYS_CLK_P 412, where the differential input pair is formed by transistors 414 and 416. Current flow through transistor 414 is dependent on transistors 418 and 420 because a first non-gate terminal of transistor 414 is connected to non-gate terminal of transistors 418 and 420. Transistors 418 and 420 are controlled by a first bias signal, BIAS_1 422, generated from the first bias control stage 408. The first bias signal 422 is wire-ORed to adjustment control voltage Vsys_1 529 (also shown in FIG. 4a as being generated by adjustment circuit 528). Current flow through transistor 414 is also dependent on transistors 424, 426, 428, and 430 because a second non-gate terminal of transistor 414 is connected to non-gate terminals of transistors 424, 426, 428, and 430. Transistors 424, 426, 428, and 430 serve as load resistances. The effective resistance values of transistors 424 and 428 are dependent on a second bias signal, BIAS_2 432, generated from the first bias control stage 408. The second bias signal 432 is wire-ORed to adjustment control voltage Vsys_2 531 (also shown in FIG. 4a as being generated by adjustment circuit 530). The resistance values of transistors 426 and 430 are not dependent on the second bias signal 432. Further, as shown in FIG. 4b, an input to transistor 434 is connected to a non-gate terminal of transistor 414 and is thus dependent on the amount of current flow through transistors 424, 426, 428, 430, 414, 418, and 420.

Current flow through transistor 416 is dependent on transistors 418 and 420 because a first non-gate terminal of transistor 416 is connected to non-gate terminal of transistors 418 and 420. As mentioned above, transistors 418 and 420 are controlled by the first bias signal 422. Current flow through transistor 416 is also dependent on transistors 436, 438, 440, and 442 because a second non-gate terminal of transistor 416 is connected to non-gate terminals of transistors 436, 438, 440, and 442. Transistors 436, 438, 440, and 442 serve as load resistances, where the resistance values of transistors 438 and 442 are dependent on the second bias signal 432, and where the resistance values of transistors 436 and 440 are not dependent on the second bias signal 432. Further, as shown in FIG. 4b, an input to transistor 444 is connected to a non-gate terminal of transistor 416 and is thus dependent on the amount of current flow through transistors 436, 438, 440, 442, 416, 418, and 420.

Based on the input to transistor 444, a particular amount of current flows to a non-gate terminal of transistor 446 and to gate terminals of transistors 446 and 448. A non-gate terminal of transistor 448 is connected to an input of a buffer 450, where the buffer 450 outputs the system clock, SYS_CLK 452. A non-gate terminal of transistor 434 is also connected to the input of the buffer 450. Thus, the value of the system clock 452 is dependent on the inputs to transistors 434 and 444.

For purposes of this description, transistors 444, 446, 448, and 434 and buffer 450 form a "first output stage." In addition, those skilled in the art will understand that transistors 454, 456, 458, and 460 serve as transistor-formed capacitances that are used to decouple noise from particular signals.

The feedback clock path 406 includes a differential input pair for receiving differential components of the system clock, FBK_CLK_N 462 and FBK_CLK_P 464, where the differential input pair is formed by transistors 466 and 468. Current flow through transistor 466 is dependent on transistors 470 and 472 because a first non-gate terminal of transistor 466 is connected to non-gate terminal of transistors 470 and 472. Transistor 470 is controlled by a third bias signal 473 generated from the second bias control stage 409, where the third bias signal 473 is wire-ORed to adjustment control voltage Vfbk_1 533 (also shown in FIG. 4a as being generated by adjustment circuit 532). Transistor 472 is not dependent on the third bias signal 473. Current flow through transistor 466 is also dependent on transistors 474, 476, 478, and 480 because a second non-gate terminal of transistor 466 is connected to non-gate terminals of transistors 474, 476, 478, and 480. Transistors 474, 476, 478, and 480 serve as load resistances, where the resistance value of transistor 474 is dependent on a fourth bias signal 481 generated from the second bias control stage 409. The fourth bias signal 481 is wire-ORed to adjustment control voltage Vfbk_2 535 (also shown in FIG. 4a as being generated by adjustment circuit 534). The resistance value of transistor 480 is not dependent on the fourth bias signal 481 and transistors 476 and 478 are 'off' due to their inputs being connected to Vdd. Further, as shown in FIG. 4b, an input to transistor 482 is connected to a non-gate terminal of transistor 466 and is thus dependent on the amount of current flow through transistors 474, 480, 466, 470, and 472.

Current flow through transistor 468 is dependent on transistors 470 and 472 because a first non-gate terminal of transistor 468 is connected to non-gate terminal of transistors 470 and 472. As mentioned above, transistor 470 is controlled by the first bias signal 422 and transistor 472 operates independently of the first bias signal 422. Current flow through transistor 468 is also dependent on transistors 484, 486, 488, and 490 because a second non-gate terminal of transistor 468 is connected to non-gate terminals of transistors 484, 486, 488, and 490. Transistors 484, 486, 488, and 490 serve as load resistances. The resistance value of transistor 490 is dependent on the second bias signal 432. The resistance value of transistor 484 is not dependent on the second bias signal 432 and transistors 486 and 488 are 'off' due to their inputs being connected to Vdd. Further, as shown in FIG. 4b, an input to transistor 492 is connected to a non-gate terminal of transistor 468 and is thus dependent on the amount of current flow through transistors 484, 490, 468, 470, and 472.

Based on the input to transistor 492, a particular amount of current flows to a non-gate terminal of transistor 494 and to gate terminals of transistors 494 and 496. A non-gate terminal of transistor 496 is connected to an input of a buffer 498, where the buffer 498 outputs the feedback clock, FBK_CLK 500. A non-gate terminal of transistor 482 is also connected to the input of the buffer 498. Thus, the value of the feedback clock 500 is dependent on the inputs to transistors 482 and 492.

For purposes of this description, transistors 492, 494, 496, and 482 and buffer 498 form a "second output stage." In addition, those skilled in the art will understand that transistors 502, 504, 506, and 508 serve as transistor-formed capacitances that are used to decouple noise from particular signals.

By adjusting the second and fourth bias signal 432 and 481, the effective load resistances of (1) transistors 424, 426, 428, and 430, (2) transistors 436, 438, 440, and 44, (3) transistors 474, 476, 478, and 480, and (4) transistors 484, 486, 488, and 490 may be varied. Similarly, by adjusting the first and third bias signals 422 and 473, the flow of current (1) through transistors 418 and 420 to transistor 414, (2) through transistors 418 and 420 to transistor 416, (3) through transistor 470 to transistor 466, and (4) through transistor 470 to transistor 468 may be varied. Those skilled in the art will appreciate that by varying the dynamics of the input receiver 402, a point of operation may be achieved at which the propagation delay of the system clock through the input receiver 402 and the propagation delay of the feedback clock through the input receiver 402 substantially match. Further, those skilled in the art will appreciate that by facilitating a control of the propagation delays of the system and feedback clocks through the input receiver 402, the propagation delays of the system and feedback clocks may also be minimized.

Those skilled in the art will appreciate that by altering the delays of a system clock and a feedback clock at an input of a PLL, static phase error of the PLL may be reduced.

Those skilled in the art will also appreciate that the input receiver 402, in addition to substantially matching the propagation delays of the system and feedback clocks through the input receiver 402, the input receiver 402 outputs buffered versions of the system and feedback clocks.

Figure 4C:
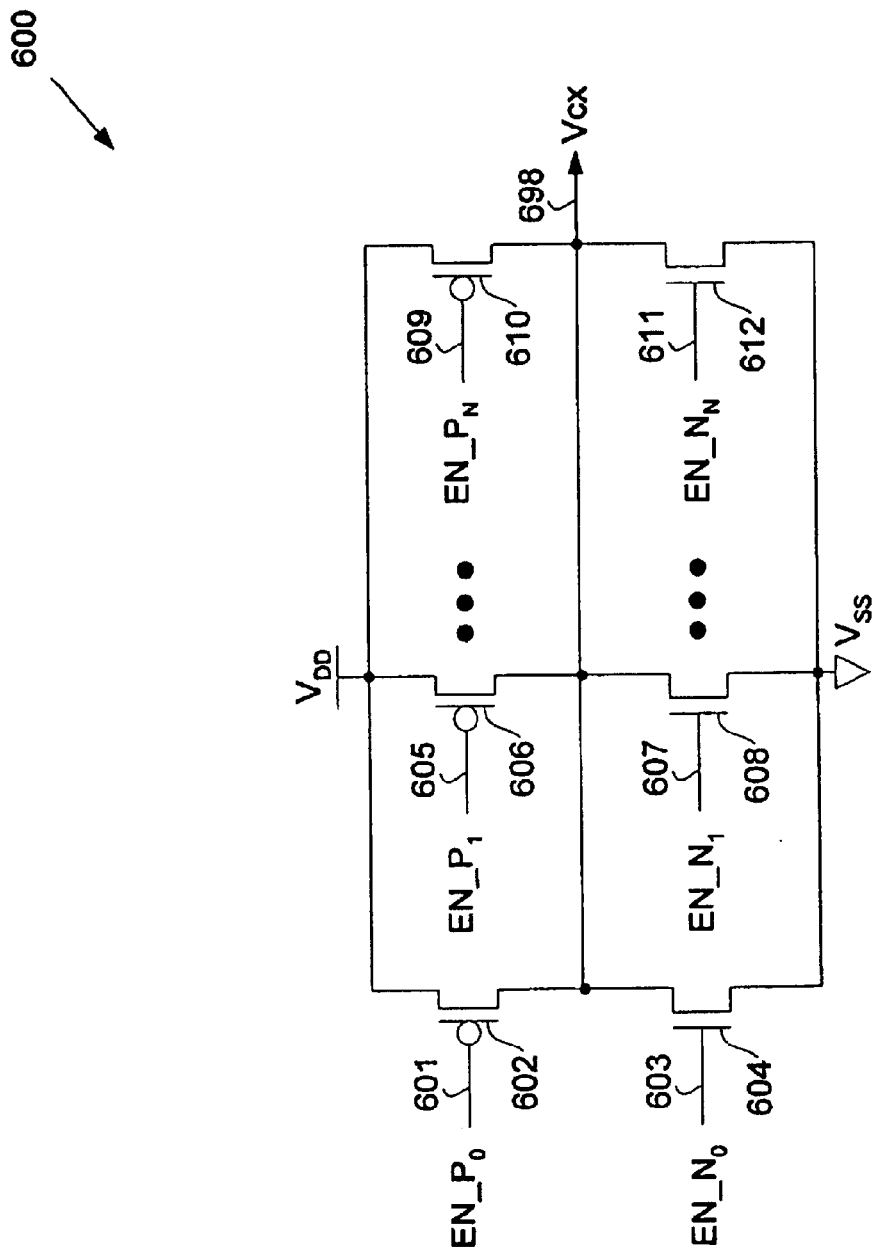
FIG. 4c shows an adjustment circuit in accordance with an embodiment of the present invention.

FIG. 4c shows an exemplary adjustment circuit 600 in accordance with the embodiment shown in FIG. 4a. Those skilled in the art will understand that the adjustment circuit 600 shown in FIG. 4c is representative of the adjustment circuits 528, 530, 532, and 534 shown in FIG. 4a.

In FIG. 4c, the adjustment circuit 600 includes p-channel transistors 602, 606, and 610 arranged in parallel with each other. The p-channel transistors 602, 606, and 610 connect between a power supply, Vdd, and a common node, Vcx 698. The common node Vcx 698 corresponds to adjustment control voltages Vsys_1 529, Vsys_2 531, Vfbk_1 533, and Vfbk_2 535 in FIG. 4a. Referring back to FIG. 4c, the adjustment circuit 600 also includes n-channel transistors 604, 608, and 612 arranged in parallel with each other. The n-channel transistors 604, 608, and 612 connect between ground, Vss, and the common node 698. The p-channel transistors 602, 606, and 610 are controlled by control signals EN_P$_0$ 601, EN_P$_1$ 605, and EN_P$_N$ 609, respectively. The n-channel transistors 604, 608, and 612 are controlled by control signals EN_N$_0$ 603, EN_N$_1$ 607, and EN_N$_N$ 611, respectively. A low voltage on any of the EN_P signals 601, 605, and 609 will turn 'on' their respective p-channel transistors 602, 606, and 610. A high voltage on any of the EN_N signals 603, 607, and 611 will turn 'on' their respective n-channel transistors 604, 608, and 612.

Any p-channel transistor 602, 606, and 610 that is 'on' will have a tendency to increase the voltage on Vcx 698 toward Vdd. Any n-channel transistor 604, 608, and 612 that is 'on' will have a tendency to lower the voltage on Vcx 698 toward Vss. By selecting which p-channel transistors 602, 606, and 610 and/or n-channel transistors 604, 608, and 612 are 'on', a change in the voltage on Vcx 698 may be achieved.

It should be understood that the p-channel transistors 602, 606, and 610 and n-channel transistors 604, 608, and 612 may be turned 'on' individually or as a group. The p-channel transistors 602, 606, and 610 and n-channel transistors 604, 608, and 612 may be sized so that each transistor has a different effect as compared to the other transistors, e.g., a transistor's gate width may be varied to adjust the strength of the transistor. The gate widths may be designed to provide a linear, exponential, or other function as more transistors are turned 'on.' The p-channel transistors 602, 606, and 610 and n-channel transistors 604, 608, and 612 may be sized so that each transistor has an inherently resistive nature, e.g., a transistor's gate length may be increased ('long-channel' transistors) to increase the inherent resistance of the transistor. A larger inherent resistance may be advantageous if both a p-channel transistor and a n-channel transistor are 'on' simultaneously. In other embodiments, the adjustment circuit 600 may include only one p-channel transistor and one n-channel transistor connected in series.

The k control signals 542 in FIG. 4a may represent EN_N signals 603, 607, and 611 in FIG. 4c and EN_P signals 601, 605, and 609 in FIG. 4c. In other words, the k control signals 542 in FIG. 4a are used to turn 'on' or 'off' the p-channel transistors 602, 606, and 610 in FIG. 4c and n-channel transistors 604, 608, and 612 in FIG. 4c.

As mentioned above with reference to FIG. 4b, those skilled in the art will appreciate that by selectively controlling an adjustment circuit, such as the one shown in FIG. 4c, the adjustment circuit may be used to adjust a particular bias signal within an input receiver of a phase locked loop, thereby adjusting current and resistive properties of particular circuitry within the input receiver in order to attain a desired propagation delay of a signal responsive to the particular circuitry.

Advantages of the present invention may include one or more of the following. In some embodiments, because a phase locked loop includes an input receiver that facilitates the matching of delays of a system clock and a feedback clock at an input to the phase locked loop, static phase error of the phase locked loop may be reduced.

In some embodiments, because a phase locked loop includes an input receiver that facilitates the reducing of delays of a system clock and a feedback clock at an input to the phase locked loop, phase locked loop performance may be improved.

In some embodiments, because a phase locked loop includes an input receiver that is selectively controllable to vary/adjust delays of a system clock and a feedback clock, a designer has increased flexibility in achieving desired phase locked loop performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claim is:

1. An integrated circuit, comprising:
    a phase locked loop comprising:
        a voltage controlled oscillator that generates an output clock dependent on an input thereto,
        an input receiver comprising a system clock path and a feedback clock path, wherein the input receiver comprises circuitry configured to modulate a delay of the system clock and a delay of the feedback clock,
        a phase frequency detector responsive to the input receiver, and
        a bias generator, responsive to the phase frequency detector, arranged to provide a voltage to the input of the voltage controlled oscillator; and
    an adjustment circuit operatively connected to the input receiver, wherein the adjustment circuit is controllable to adjust any one of the delay of the system clock and the delay of the feedback clock.

2. The integrated circuit of claim 1, wherein the system clock serves as an input to the phase locked loop.

3. The integrated circuit of claim 1, wherein the feedback clock is dependent on the output clock.

4. The integrated circuit of claim 1, wherein the adjustment circuit is adapted to be controlled by a binary control word.

5. The integrated circuit of claim 1, wherein the input receiver is adapted to output a buffered system clock and a buffered feedback clock, and wherein the phase frequency detector is adapted to detect a phase difference between the buffered system clock and the buffered feedback clock.

6. The integrated circuit of claim 1, wherein the adjustment circuit comprises:
    a first device that selectively facilitates current flow between a power supply and an output of the adjustment circuit; and
    a second device that selectively facilitates current flow between the output of the adjustment circuit and ground.

7. The integrated circuit of claim 6, wherein the first device comprises a p-channel transistor and the second device comprises an n-channel transistor, and wherein the p-channel transistor and the n-channel transistor are arranged in series.

8. The integrated circuit of claim 6, wherein the adjustment circuit further comprises a third device arranged in parallel with the first device.

9. The integrated circuit of claim 8, wherein the first device has a longer channel than the third device.

10. The integrated circuit of claim 8, wherein the first device has a greater gate width than the third device.

11. The integrated circuit of claim 6, wherein the first adjustment circuit comprises a third device arranged in parallel with the second device.

12. The integrated circuit of claim 11, wherein the second device has a longer channel than the third device.

13. The integrated circuit of claim 11, wherein the second device has a greater gate width than the third device.

14. The integrated circuit of claim 1, further comprising:
    a first bias control stage operatively connected to the system clock path, wherein an output of the adjustment circuit is operatively connected to an output of the first bias control stage.

15. The integrated circuit of claim 14, wherein the system clock path comprises:
    a first differential input arranged to receive differential components of the system clock, wherein the first differential input is operatively connected to system clock path circuitry responsive to the first bias control stage and the adjustment circuit.

16. The integrated circuit of claim 15, wherein the input receiver comprises:
    a first output stage responsive to the first differential input and the system clock path circuitry.

17. The integrated circuit of claim 1, further comprising:
    a second bias control stage operatively connected to the feedback clock path, wherein an output of the adjustment circuit is operatively connected to an output of the second bias control stage.

18. The integrated circuit of claim 17, wherein the feedback clock path comprises:
    a second differential input arranged to receive differential components of the feedback clock, wherein the second differential input is operatively connected to feedback clock path circuitry responsive to the second bias control stage and the adjustment circuit.

19. The integrated circuit of claim 18, wherein the input receiver further comprises:
    a second output stage responsive to the second differential input and the feedback clock path circuitry.

20. A phase locked loop, comprising:
    an input receiver adapted to receive as input a system clock and a feedback clock and is responsive to an adjustment circuit operatively connected to the input receiver, wherein the input receiver comprises circuitry configured to modulate a delay of the system clock and a delay of the feedback clock;
    a phase frequency detector responsive to the input receiver;
    a bias generator responsive to the phase frequency detector; and
    a voltage controlled oscillator responsive to the bias generator, wherein the voltage controlled oscillator is adapted to output an output clock.

21. The phase locked loop of claim 20, wherein the system clock serves as an input to the phase locked loop.

22. The phase locked loop of claim 20, wherein the feedback clock is dependent on the output clock.

23. The phase locked loop of claim 20, wherein the adjustment circuit is adapted to be controlled by a binary control word.

24. The phase locked loop of claim 20, wherein the input receiver is adapted to output a buffered system clock and a buffered feedback clock, and wherein the phase frequency detector is adapted to detect a phase difference between the buffered system clock and the buffered feedback clock.

25. The phase locked loop of claim 20, wherein the adjustment circuit comprises:
   a first device that selectively facilitates current flow between a power supply and an output of the adjustment circuit; and
   a second device that selectively facilitates current flow between the output of the adjustment circuit and ground.

26. The phase locked loop of claim 20, wherein the input receiver comprises a system clock path and a feedback clock path, wherein the system clock path comprises:
   a first differential input arranged to receive differential components of the system clock, wherein the first differential input is operatively connected to system clock path circuitry responsive to a first bias control stage and the adjustment circuit.

27. The phase locked loop of claim 26, wherein the input receiver further comprises:
   a first output stage responsive to the first differential input and the system clock path circuitry.

28. The phase locked loop of claim 26, wherein the feedback clock path comprises:
   a second differential input arranged to receive differential components of the feedback clock, wherein the second differential input is operatively connected to feedback clock path circuitry responsive to a second bias control stage and the adjustment circuit.

29. The phase locked loop of claim 28, wherein the input receiver further comprises:
   a second output stage responsive to the second differential input and the feedback clock path circuitry.

30. A method for post-silicon adjustment of a phase locked loop, comprising:
   inputting a system clock and a feedback clock to an input receiver, wherein the input receiver comprises circuitry configured to modulate a delay of the system clock and a delay of the feedback clock;
   selectively adjusting a delay of any one of the system clock and the feedback clock using an adjustment circuit operatively connected to the input receiver;
   comparing the system clock and the feedback clock; and
   generating a voltage to a voltage controlled oscillator dependent on the comparing, wherein the voltage controlled oscillator generates an output clock.

31. The method of claim 30, wherein selectively adjusting the delay comprises:
   controlling a first current flow between a power supply and an output of the adjustment circuit; and
   controlling a second current flow between the output of the adjustment circuit and ground.

32. The method of claim 30, wherein the system clock serves as an input to the phase locked loop.

33. The method of claim 30, wherein the feedback clock is dependent on the output clock.

34. The method of claim 30, wherein the adjustment circuit is controlled by a binary control word.

35. An integrated circuit, comprising:
   phase locked loop means for generating an output clock, wherein the phase locked loop means comprises:
      input means for inputting a system clock and a feedback clock, wherein the input means comprises means for modulating a delay of the system clock and the feedback clock,
      charge pumping means for generating a control voltage, wherein the charge pumping means is responsive to the input means,
      bias generating means for generating a bias voltage, wherein the bias generating means is responsive to the control voltage, and
      oscillator means for generating the output clock, wherein the oscillator means is responsive to the bias voltage; and
   adjusting means for adjusting a delay of any one of the system clock and the feedback clock, wherein the adjusting means is operatively connected to the input means.

* * * * *